United States Patent [19]

Job et al.

[11] 4,322,776
[45] Mar. 30, 1982

[54] THERMAL INTERCONNECTION

[75] Inventors: Frederick D. Job, Anaheim; Charles E. Eberly, Placentia, both of Calif.

[73] Assignee: Hughes Aircraft Company, Culver City, Calif.

[21] Appl. No.: 174,977

[22] Filed: Aug. 4, 1980

[51] Int. Cl.³ .............................................. H05K 7/20
[52] U.S. Cl. .................................... 361/386; 361/415; 267/158; 165/185
[58] Field of Search ................ 267/158, 182; 361/381, 361/382, 385, 386, 388, 415; 165/80, 185; 174/16 HS; 211/41

[56] References Cited

U.S. PATENT DOCUMENTS 4,096,547 6/1978 Calabro .............................. 361/388
4,214,292 7/1980 Johnson .............................. 267/158

Primary Examiner—Gerald P. Tolin
Attorney, Agent, or Firm—Allen A. Dicke, Jr.; W. H. MacAllister

[57] ABSTRACT

Spring 52 mounts on cold plate 12 to urge thermal conductive layers 82 against flange 20 on cold plate 12. Spring has a plurality of pressure flanges, one corresponding to each cold plate flange so that a unitary spring structure can be quickly assembled on the cold plate.

Thermal interconnection is expected to be used on all standard and improved standard electronic modules. It is being designed into ANSQS-53.

12 Claims, 4 Drawing Figures

THERMAL INTERCONNECTION

BACKGROUND OF THE INVENTION

This invention is directed to a thermal interconnection and particularly a structure by which heat can be removed from a thermally conductive layer of a printed circuit board. The thermal interconnection includes a cooled mass against which the thermally conductive layer of the printed circuit board is spring urged.

Printed circuit boards or cards are commonly used in modern electronics systems for the provision of conductors and for the mounting of circuit elements. These circuit boards often have printed circuitry on one side thereof and have the circuit components mounted on the other side thereof with terminal wires extending through the board so that soldering of all the components to the circuitry can be accomplished in one pass. On the other hand, some of the boards have multiple layers of printed circuitry to enable crossover. There are many varieties of such boards, for various different types of uses.

The life of most electronic components is a function of operating temperature. The operating temperature is a function of the power loss therein, the ambient temperature around the circuitry and the capability of conducting heat away from the electronic components. In order to maximize the life of electronics, various types of cooling thereof have been employed. The simplest is the circulation of cool gas, usually air, past the printed circuit boards and the electronics thereon. However, in order to operate the electronics at a higher electronic capacity, and still maintain a reasonable life, forced cooling is necessary. Previously, a cooled mass has been provided and each circuit board has been resiliently urged against a portion of the mass, each by an individual spring. This provided cooling for each circuit board so that a plurality of such circuit boards could be positioned closely adjacent each other and could each be positively cooled. However, there is need for a more economically producible and easily usable structure.

SUMMARY OF THE INVENTION

In order to aid in the understanding of this invention it can be stated in essentially summary form that is directed to a thermal interconnection wherein a cooled mass has a plurality of flanges thereon and a plurality of circuit boards are respectively, individually resiliently held against the flanges by a single spring so that the circuit boards are cooled.

It is a purpose of this invention to provide a structure wherein a plurality of circuit boards are respectively held against the plurality of cooled flanges by a spring assembly so that a plurality of such circuit boards can be conveniently and easily cooled in a convenient way by a conveniently handled assembly.

Other purposes and advantages of this invention will become apparent from a study of the following portion of the specification, the claims and the attached drawings.

DESCRIPTION OF THE PREFERRED EMBODIMENT

Figure 1:
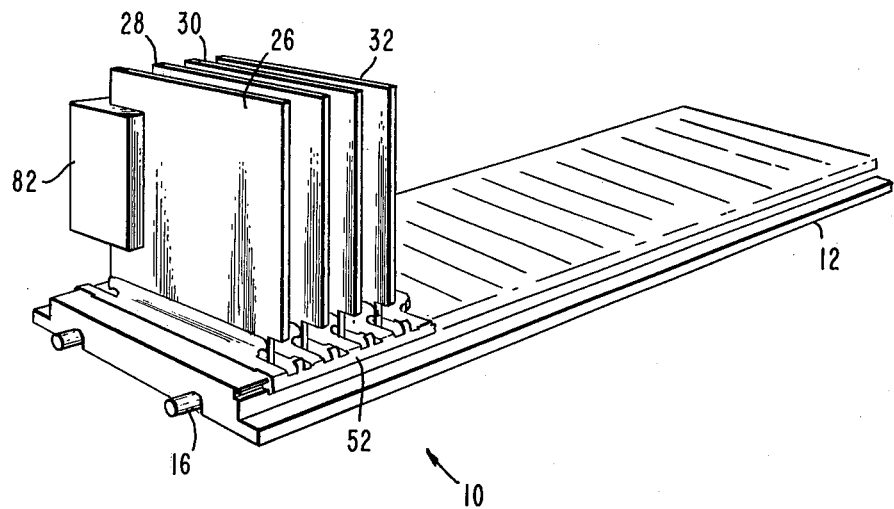
FIG. 1 is a perspective view of a cooled mass, with a plurality of circuit boards mounted thereon for cooling, by means of the spring which forms a part of this invention.
Figure 4:
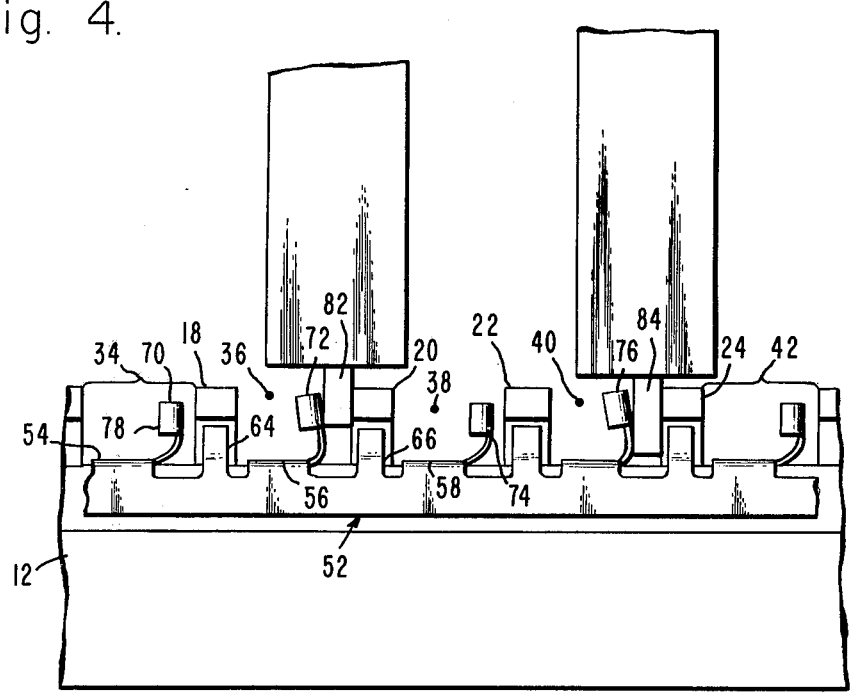
FIG. 4 is an enlarged side elevational view of the structure of FIG. 1, with parts broken away.
Figure 3:
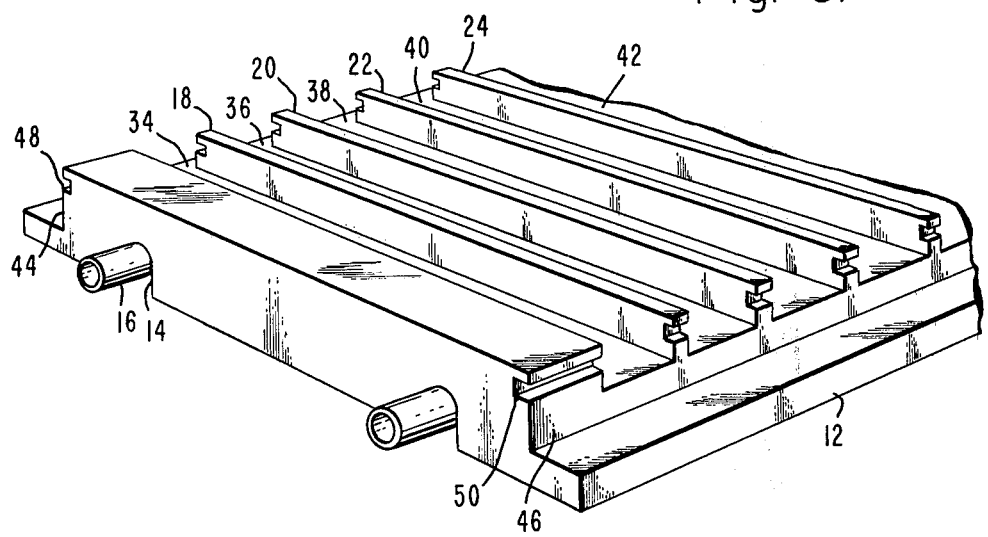
FIG. 3 is a perspective view of the cooled mass with its flanges, with parts broken away.

The thermal interconnection of this invention is generally indicated at 10 in FIGS. 1 and 4. A cooled mass 12, see FIGS. 1, 3 and 4, is a chilled plate made of material of a high thermal conductivity, such as aluminum which is preferably nickel plated for wear resistance. On its underside it has a channel 14 milled therein into which is pressed coolant tube 16. Coolant tube 16 is continuous and it is in thermal interconnection with cooled plate 12 by being brazed, pressed or adhesively secured into groove 14. A suitable (usually liquid) coolant is circulated through tube 16. The coolant may be a water-glycol mixture ranging from all water to all glycol. It may be a refrigerant such as freon or any other convenient or conventional coolant fluid, depending upon the heat load and temperature desired.

On its upper surface the cold plate has a plurality of upstanding flanges, four of which are indicated at 18, 20, 22 and 24. These flanges extend over the length of the cold plate 12, as schematically indicated in FIG. 1. The cold plate 12 is planned to cool a plurality of circuit boards, four of which are shown at 26, 28, 30 and 32. One circuit board can be installed for each flange, although lesser may be used. Slots are formed crosswise of the cooled plate 12 to define the flanges. Some of these slots are shown at 34, 36, 38, 40 and 42 in FIGS. 3 and 4.

The slots and flanges terminate at faces 44 and 46 on cold plate 12. The faces may extend all the way to the bottom of the plate, but as shown in FIG. 3, the faces are formed above a step in the cold plate. Notches 48 and 50 are cut into the faces 44 and 46 respectively. The notches 48 and 50 are above the step in the plate and above the bottom of the slots 34, 36, 38, 40 and 42 so that the notches extend through the ends of the flanges. This structure permits the positioning thereon of spring 52, which is the spring which urges the circuit boards into thermal contact with the flanges.

Figure 2:
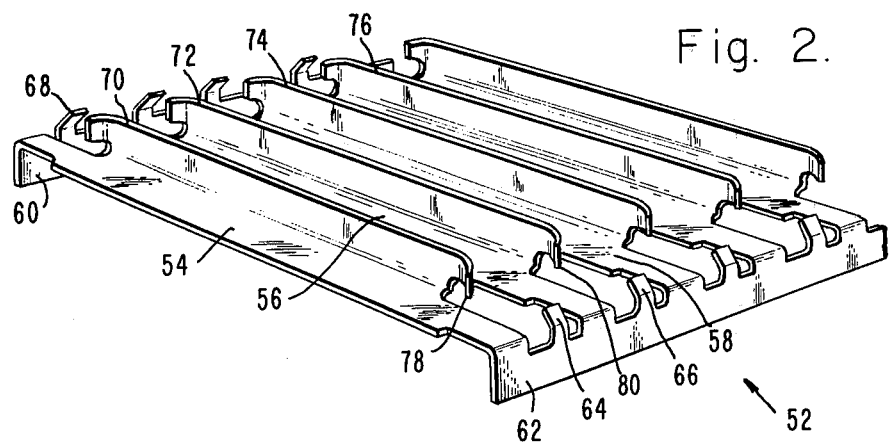
FIG. 2 is a perspective view of the spring assembly, with parts broken away.

Spring 52 is formed of resilient material which is bendable into the desired shape. If necessary, after the bending, the spring is heat-treated to provide its resilient properties. Spring 52 has a plurality of cross pieces, several of which are shown at 54, 56 and 58 in FIGS. 2 and 4. End plates 60 and 62 are turned down from the cross pieces and are dimensioned to embrace the faces 44 and 46. Fingers are formed on the end plate between the cross pieces to extend upwardly and angularly toward each other, usually at a 30° to 45° angle with respect to the vertical. These fingers are shown at 64, 66 and 68. The fingers are dimensioned so that when the cross pieces are pressed down into the slots as illustrated in FIG. 4, then the fingers snap into the notches 48 and 50 to retain the cross pieces down adjacent the bottom of the slots.

Adjacent each cross piece on the spring is an upwardly formed pressure flange. Four of the pressure flanges are indentified in FIGS. 2 and 4 as pressure flanges 70, 72, 74 and 76. These pressure flanges face the cooling flanges 18, 20, 22 and 24, respectively, and on their ends have curved sections to aid in the entry of the circuit boards. Curved sections 78 and 80 are illustrated on the near end of pressure flanges 70 and 72 in FIG. 2.

It is seen that there are pluralities of flanges, slots, etc., and for each of the flanges 18–24 etc., there is a pressure flange 70–76 etc., so that there is the capability of applying pressure against any one of the cold plate flanges.

Each of the circuit boards has a thermally conductive layer, with the thermally conductive layers of circuit boards 28 and 30 indicated at 82 and 84 in FIG. 4. Printed circuitry or other electronics is attached to the sides of these board with thermally conductive layers, and it is the purpose of the thermally conductive layers to conduct heat away from the electronics. While a thermally conductive layer is illustrated as extending only from the bottom of each of the printed circuit boards, each thermally conductive layer may also extend out of the top of the circuit boards so that a similar thermal interconnection 10 with its cold plate 12 can be placed above the circuit board for duplicating and inverting the structure shown in FIG. 4.

As the circuit boards are put in place, they are slid in from the front as seen in FIGS. 1 and 4. The thermally conductive layer engages against the curved section on the near end of the pressure flange of the spring, bending the spring back as the board slides in. The spring is preferably coated with a dry lubricant such as molybdenum disulfide to ease insertion. The opposing force on the spring is taken up by the cross piece engaging against the back of the adjacent cold plate flange. As the spring pressure flange bends back, space is made for the circuit board to slide into place. As the board slides in (optionally also in a similar engagement of the top of the circuit board) its back end engages with electrical connector, see FIG. 1, wherein the desired electrical connections are made to the circuitry on the circuit boards. FIG. 4 illustrates that the layers 82 and 84 may be of different lengths, but still be effective. In this way, thermal and electrical connections are made when the circuit board is put into place. The force of the pressure flange of the spring urges the thermally conductive layer against the cooled flange on the cold plate so that pressure is maintained at the thermal junction to enhance thermal conductivity, to permit heat to be withdrawn from the printed circuit board. In this way, circuit boards can be easily installed and removed and sound thermal interconnections made during the installation.

This invention has been described in its presently contemplated best mode and it is clear that it is susceptible to numerous modifications, modes and embodiments within the ability of those skilled in the art and without the exercise of the inventive faculty. Accordingly, the scope of the invention is defined by the scope of the following claims.

What is claimed is:

1. A thermal interconnection comprising:
a cold plate having a plurality of upstanding flanges, with slots between said cold plate flanges, said cold plate having end faces at the end of said flanges;
a spring positioned on said cold plate, said spring having a plurality of cross pieces, each said cross piece being respectively positioned in a slot between said flanges on said cold plate, said cross pieces each engaging against the flange on one side of its cold plate slot, a spring pressure flange curved upwardly from each of cross pieces, said spring pressure flange facing the cold plate flange on the other side of said cold plate slot containing its cross piece, each of said cross pieces having the spring pressure flange facing an adjacent cold plate flange.

2. The thermal interconnection of claim 1 wherein each of said spring pressure flanges has a curved section at its end so that the thermally conductive layer of a circuit board can be pressed into the space between the spring pressure flange and the cold plate flange which it faces, with the resilient bending of said spring pressure flange adapted to urge the thermally conductive layer against the cold plate flange to enhance thermal conductivity.

3. The thermal interconnection of claim 2 wherein an end plate is attached to each of said cross pieces to maintain said spring as a unitary structure.

4. The thermal interconnection of claim 3 wherein there is an end plate on each end of said cross pieces and said end plates are positioned to lie against said end faces on said cold plate.

5. The thermal interconnection of claim 4 wherein there is a notch in said face on each end of said cold plate and each said end plate carries a finger for resiliently engaging in said notch to retain said cross pieces in the bottom of said slots in said cold plate.

6. The thermal interconnection of claim 1 wherein an end plate is attached to each of said cross pieces to maintain said spring as a unitary structure.

7. The thermal interconnection of claim 6 wherein there is an end plate on each end of said cross pieces and said end plates are positioned to lie against said end faces on said cold plate.

8. The thermal interconnection of claim 7 wherein there is a notch formed in said face on each end of said cold plate and each said end plate carries a finger for resiliently engaging in said notch to retain said cross pieces in the bottom of said slots in said cold plate.

9. The thermal interconnection of claim 1 further including a circuit board in combination therewith, said circuit board having a thermally conductive layer therein and said thermally conductive layer being interengaged between said pressure flange on said spring and said flange on said cold plate for cooling said thermally conductive layer in said circuit board.

10. The thermally interconnection of claim 4 further including a circuit board in combination therewith, said circuit board having a thermally conductive layer therein and said thermally conductive layer being interengaged between said pressure flange on said spring and said flange on said cold plate for cooling said thermally conductive layer in said circuit board.

11. The thermal interconnection of claim 8 further including a circuit board in combination therewith, said circuit board having a thermally conductive layer therein and said thermally conductive layer being interengaged between said pressure flange on said spring and said flange on said cold plate for cooling said thermally conductive layer in said circuit board.

12. A spring for a thermal interconnection, said spring comprising:
a plurality of flat, parallel, rectangular cross pieces spaced from each other;
end plates attached to both ends of each of said cross pieces, said end plates being positioned substantially at right angles to the plane of said cross pieces and extending substantially parallel to each other;

an upward and inward extending finger secured to said end plates at least between some of said cross pieces, said fingers being resilient;

and upwardly extending pressure flange formed on each of said cross pieces, said pressure flanges being positioned at one edge of each of said cross pieces and extending upwardly from the plane of said cross pieces transverse to the direction of said end plates, said pressure flanges being for applying pressure to a thermally conductive layer of a circuit board to press it against a cold plate flange, each of said pressure flanges having a curved section on the same end, said curved section being curved backward from the face of said spring pressure flange in a direction toward said cross piece.

* * * * *